(12) United States Patent
Harris, IV (10) Patent No.: US 7,983,024 B2
(45) Date of Patent: Jul. 19, 2011

(54) FUSE CARD SYSTEM FOR AUTOMOTIVE CIRCUIT PROTECTION

(75) Inventor: Edwin J. Harris, IV, Oak Park, IL (US)

(73) Assignee: Littelfuse, Inc., Des Plaines, IL (US)

( * ) Notice: Subject to any disclaimer, the term of this patent is extended or adjusted under 35 U.S.C. 154(b) by 370 days.

(21) Appl. No.: 11/739,486

(22) Filed: Apr. 24, 2007

(65) Prior Publication Data
US 2008/0268671 A1 Oct. 30, 2008

(51) Int. Cl.
*H02B 1/04* (2006.01)
*H01H 85/46* (2006.01)
*H05K 3/00* (2006.01)
*H01R 13/68* (2011.01)
*H05K 7/00* (2006.01)

(52) U.S. Cl. ........ 361/629; 361/630; 361/833; 361/837; 337/188; 337/216; 439/620.27; 29/829

(58) Field of Classification Search .......... 361/628–630, 361/833, 837; 337/188, 216; 439/620.27; 29/829
See application file for complete search history.

(56) References Cited

U.S. PATENT DOCUMENTS

| | | |
|---|---|---|
| 480,802 A | 8/1892 | Blathy |
| 1,700,582 A | 1/1929 | Brown |
| 2,245,346 A | 6/1941 | Klein |
| 2,794,346 A | 6/1957 | Jacobs, Jr. |
| 3,619,725 A | 11/1971 | Soden et al. |
| 3,775,723 A | 11/1973 | Mamrock et al. |
| 3,887,893 A | 6/1975 | Brandt et al. |
| 3,909,767 A | 9/1975 | Williamson et al. |
| 3,913,219 A | 10/1975 | Lichtblau |
| 3,978,443 A | 8/1976 | Dennis et al. |
| 4,023,265 A | 5/1977 | Aryamane |
| 4,031,497 A | 6/1977 | Ozawa |
| 4,071,837 A | 1/1978 | Ranzanigo |
| 4,099,320 A | 7/1978 | Schmidt, Jr. et al. |
| 4,131,869 A | 12/1978 | Schmidt, Jr. et al. |
| 4,149,137 A * | 4/1979 | Konnemann ................... 337/295 |
| 4,164,725 A | 8/1979 | Wiebe |
| 4,198,744 A | 4/1980 | Nicolay |
| 4,208,080 A * | 6/1980 | Teagno ........................... 439/45 |
| 4,224,592 A | 9/1980 | Urani et al. |
| 4,237,522 A * | 12/1980 | Thompson .................... 361/746 |
| 4,278,706 A | 7/1981 | Barry |
| 4,411,486 A * | 10/1983 | Behrendt ................. 439/620.28 |
| 4,494,104 A * | 1/1985 | Holmes ......................... 337/403 |
| 4,495,546 A * | 1/1985 | Nakamura et al. ............ 361/749 |
| 4,503,415 A | 3/1985 | Rooney |
| 4,504,816 A | 3/1985 | Viola et al. |
| 4,514,718 A | 4/1985 | Birx |
| 4,533,896 A | 8/1985 | Beloposky |

(Continued)

FOREIGN PATENT DOCUMENTS

DE 271479 3/1914

(Continued)

*Primary Examiner* — Jayprakash N Gandhi
*Assistant Examiner* — Bradley H Thomas (57) ABSTRACT

A fuse assembly includes: (i) a junction box including a battery B+ board having a plurality of metallized slots and a distribution board having a plurality of metallized slots; and (ii) a plurality of fuses releasably secured within the metallized slots, the fuses each including a substrate, first and second contacts positioned on the substrate, each contact in electrical communication with one of the metallized slots, and a fuse element in electrical communication with the first and second contacts.

31 Claims, 8 Drawing Sheets

U.S. PATENT DOCUMENTS

| | | | |
|---|---|---|---|
| 4,540,969 A | 9/1985 | Sugar | |
| 4,544,907 A | 10/1985 | Takano | |
| 4,547,830 A | 10/1985 | Yamauchi | |
| 4,554,732 A | 11/1985 | Sadlo et al. | |
| 4,570,147 A | 2/1986 | Ebi | |
| 4,580,124 A | 4/1986 | Borzoni | |
| 4,604,602 A | 8/1986 | Borzoni | |
| 4,608,548 A | 8/1986 | Borzoni | |
| 4,612,529 A | 9/1986 | Gurevich et al. | |
| 4,626,818 A | 12/1986 | Hilgers | |
| 4,635,023 A | 1/1987 | Oh | |
| 4,646,053 A | 2/1987 | Mosesian | |
| 4,652,848 A | 3/1987 | Hundrieser | |
| 4,661,793 A | 4/1987 | Borzoni | |
| 4,672,352 A | 6/1987 | Takano | |
| 4,689,718 A * | 8/1987 | Maue et al. | 361/736 |
| 4,703,299 A | 10/1987 | Vermij | |
| 4,712,081 A * | 12/1987 | Bosley | 337/266 |
| 4,720,402 A | 1/1988 | Wojcik | |
| 4,726,991 A | 2/1988 | Hyatt et al. | |
| 4,771,260 A | 9/1988 | Gurevich | |
| 4,788,523 A | 11/1988 | Robbins | |
| 4,792,781 A | 12/1988 | Takahashi et al. | |
| 4,837,520 A | 6/1989 | Golke et al. | |
| 4,850,884 A * | 7/1989 | Sawai et al. | 439/76.2 |
| 4,869,972 A | 9/1989 | Hatagishi | |
| 4,871,990 A | 10/1989 | Ikeda et al. | |
| 4,873,506 A | 10/1989 | Gurevich | |
| 4,879,587 A | 11/1989 | Jerman | |
| 4,894,633 A | 1/1990 | Holtfreter | |
| 4,958,426 A | 9/1990 | Endo et al. | |
| 4,972,295 A * | 11/1990 | Suguro et al. | 361/706 |
| 4,975,551 A | 12/1990 | Syvertson | |
| 4,977,357 A | 12/1990 | Shrier | |
| 4,997,393 A | 3/1991 | Armando | |
| 4,998,086 A | 3/1991 | Kourinsky et al. | |
| 5,023,752 A * | 6/1991 | Detter et al. | 361/752 |
| 5,027,101 A | 6/1991 | Morrill, Jr. | |
| 5,084,691 A * | 1/1992 | Lester et al. | 337/297 |
| 5,095,297 A | 3/1992 | Perreault et al. | |
| 5,097,246 A | 3/1992 | Cook | |
| 5,097,247 A | 3/1992 | Doerrwaechter | |
| 5,101,187 A | 3/1992 | Yuza | |
| 5,102,506 A | 4/1992 | Tanielian | |
| 5,102,712 A | 4/1992 | Peirce et al. | |
| 5,115,220 A | 5/1992 | Suuronen et al. | |
| 5,130,688 A | 7/1992 | Van Rietschoten et al. | |
| 5,139,443 A | 8/1992 | Armando | |
| 5,140,295 A | 8/1992 | Vermot-gaud et al. | |
| 5,148,141 A | 9/1992 | Suuronen | |
| 5,155,462 A | 10/1992 | Morrill, Jr. | |
| 5,166,656 A | 11/1992 | Badihi et al. | |
| 5,179,503 A * | 1/1993 | Fouts et al. | 361/729 |
| 5,207,587 A * | 5/1993 | Hamill et al. | 439/76.2 |
| 5,228,188 A | 7/1993 | Badihi et al. | |
| 5,232,758 A | 8/1993 | Juskey et al. | |
| 5,247,248 A * | 9/1993 | Fukunaga | 324/760 |
| 5,262,754 A | 11/1993 | Collins | |
| 5,295,842 A * | 3/1994 | Ozaki et al. | 439/76.2 |
| 5,296,833 A | 3/1994 | Breen et al. | |
| 5,331,195 A | 7/1994 | Yukihiro | |
| 5,340,775 A | 8/1994 | Carruthers | |
| 5,363,082 A | 11/1994 | Gurevich | |
| 5,374,590 A | 12/1994 | Batdorf | |
| 5,438,166 A | 8/1995 | Carey et al. | |
| 5,440,802 A | 8/1995 | Whitney et al. | |
| 5,453,726 A | 9/1995 | Montgomery | |
| 5,478,244 A * | 12/1995 | Maue et al. | 439/76.2 |
| 5,513,077 A * | 4/1996 | Stribel | 361/794 |
| 5,537,108 A | 7/1996 | Nathan et al. | |
| 5,581,225 A | 12/1996 | Oh et al. | |
| 5,592,016 A | 1/1997 | Go et al. | |
| 5,592,108 A | 1/1997 | Tsukahara | |
| 5,606,301 A | 2/1997 | Ishimura | |
| 5,618,186 A * | 4/1997 | Saka et al. | 439/76.2 |
| 5,631,620 A | 5/1997 | Totsuka et al. | |
| 5,643,693 A * | 7/1997 | Hill et al. | 429/121 |
| 5,663,861 A | 9/1997 | Reddy et al. | |
| 5,668,521 A | 9/1997 | Oh | |
| 5,703,757 A * | 12/1997 | Hayes et al. | 361/752 |
| 5,715,135 A | 2/1998 | Brussalis et al. | |
| 5,726,621 A | 3/1998 | Whitney et al. | |
| 5,764,487 A * | 6/1998 | Natsume | 361/775 |
| 5,777,843 A | 7/1998 | Younce | 361/641 |
| 5,781,096 A * | 7/1998 | Yasukuni et al. | 337/297 |
| 5,788,529 A | 8/1998 | Borzi et al. | 439/364 |
| 5,790,007 A * | 8/1998 | Yasukuni | 337/166 |
| 5,805,048 A * | 9/1998 | Saitoh et al. | 337/290 |
| 5,831,814 A * | 11/1998 | Hamill | 361/627 |
| 5,841,338 A * | 11/1998 | Yasukuni | 337/293 |
| 5,844,477 A | 12/1998 | Blecha et al. | |
| 5,902,138 A * | 5/1999 | Murakami et al. | 439/76.2 |
| 5,914,649 A | 6/1999 | Isono et al. | |
| 5,928,004 A * | 7/1999 | Sumida et al. | 439/76.2 |
| 5,977,859 A * | 11/1999 | Kawamura et al. | 337/295 |
| 5,995,380 A * | 11/1999 | Maue et al. | 361/826 |
| 6,008,982 A * | 12/1999 | Smith | 361/624 |
| 6,062,916 A * | 5/2000 | Gladd et al. | 439/751 |
| 6,077,102 A | 6/2000 | Borzi et al. | |
| 6,087,889 A | 7/2000 | Mok | |
| 6,116,916 A * | 9/2000 | Kasai | 439/76.2 |
| 6,126,457 A * | 10/2000 | Smith et al. | 439/76.2 |
| 6,147,586 A * | 11/2000 | Saitoh et al. | 337/297 |
| 6,154,118 A * | 11/2000 | Ishikawa et al. | 338/22 R |
| 6,162,990 A * | 12/2000 | Sakamoto | 174/59 |
| 6,175,261 B1 | 1/2001 | Sundararaman et al. | |
| 6,180,992 B1 | 1/2001 | Gobel et al. | |
| 6,220,876 B1 * | 4/2001 | Avila et al. | 439/76.2 |
| 6,224,397 B1 * | 5/2001 | Nakamura | 439/76.2 |
| 6,261,937 B1 | 7/2001 | Tobben et al. | |
| 6,280,253 B1 * | 8/2001 | Kraus et al. | 439/620.27 |
| 6,354,868 B1 * | 3/2002 | Korczynski et al. | 439/516 |
| 6,437,986 B1 * | 8/2002 | Koshiba | 361/752 |
| 6,458,630 B1 | 10/2002 | Daubenspeck et al. | |
| 6,494,723 B2 * | 12/2002 | Yamane et al. | 439/76.2 |
| 6,496,096 B2 | 12/2002 | Kondo et al. | |
| 6,503,090 B2 * | 1/2003 | Onizuka | 439/75 |
| 6,515,226 B2 | 2/2003 | Chiriku et al. | |
| 6,541,700 B2 | 4/2003 | Chiriku et al. | |
| 6,558,198 B2 * | 5/2003 | Kobayashi et al. | 439/620.29 |
| 6,679,708 B1 * | 1/2004 | Depp et al. | 439/76.2 |
| 6,699,067 B1 * | 3/2004 | Zhao et al. | 439/516 |
| 6,759,938 B2 * | 7/2004 | Matsumura et al. | 337/161 |
| 6,761,567 B2 * | 7/2004 | Onizuka et al. | 439/76.2 |
| 6,796,808 B2 * | 9/2004 | Hosoe et al. | 439/76.2 |
| 6,796,809 B2 * | 9/2004 | Kakuta et al. | 439/76.2 |
| 6,878,004 B2 * | 4/2005 | Oh | 439/250 |
| 6,905,347 B2 * | 6/2005 | Kobayashi | 439/76.2 |
| 6,905,348 B2 * | 6/2005 | Naitou et al. | 439/76.2 |
| 7,097,491 B2 * | 8/2006 | Neumann-Henneberg | 439/395 |
| 7,099,155 B2 * | 8/2006 | Kobayashi et al. | 361/719 |
| 7,101,197 B2 * | 9/2006 | Naito et al. | 439/75 |
| 7,112,071 B2 * | 9/2006 | Nakagawa et al. | 439/82 |
| 7,189,081 B2 * | 3/2007 | Tanaka et al. | 439/76.2 |
| 7,247,031 B2 * | 7/2007 | Naito et al. | 439/75 |
| 7,249,956 B2 * | 7/2007 | Ishiguro et al. | 439/76.2 |
| 7,320,608 B2 * | 1/2008 | Kubota et al. | 439/76.1 |
| 7,381,889 B2 * | 6/2008 | Hara | 174/50 |
| 7,390,198 B2 * | 6/2008 | Oka et al. | 439/76.2 |
| 2002/0006742 A1 * | 1/2002 | Hara et al. | 439/76.2 |
| 2003/0090358 A1 * | 5/2003 | Morimoto et al. | 337/269 |
| 2003/0227764 A1 * | 12/2003 | Korczynski | 361/826 |
| 2006/0141820 A1 * | 6/2006 | Naito et al. | 439/76.1 |
| 2007/0279842 A1 * | 12/2007 | Ishida et al. | 361/600 |
| 2008/0310121 A1 * | 12/2008 | Yamashita et al. | 361/720 |

FOREIGN PATENT DOCUMENTS

| | | |
|---|---|---|
| DE | 1803554 | 5/1969 |
| DE | 3530354 A1 | 3/1987 |
| DE | 19530900 A1 | 2/1997 |
| DE | 19829472 A1 | 5/1999 |
| DE | 19817749 A1 | 6/1999 |
| DE | 19827595 A1 | 10/1999 |
| EP | 0043701 B1 | 1/1982 |
| EP | 0270954 B1 | 6/1988 |
| EP | 0285489 B1 | 10/1988 |
| EP | 0301533 B1 | 2/1989 |

| | | | | | | |
|---|---|---|---|---|---|---|
| EP | 0453217 B1 | 10/1991 | | JP | 5-166454 | 7/1993 |
| EP | 0581428 B1 | 2/1994 | | JP | 5-198245 | 8/1993 |
| EP | 0802553 B1 | 10/1997 | | JP | 5-314888 | 11/1993 |
| EP | 0939417 A1 | 9/1999 | | JP | 6-36675 | 2/1994 |
| EP | 1109190 A1 | 6/2001 | | JP | 6-96654 | 4/1994 |
| GB | 1477572 | 6/1977 | | JP | 6-150802 | 5/1994 |
| GB | 1604820 | 12/1981 | | JP | 6-103880 | 12/1994 |
| GB | 2089148 | 6/1982 | | JP | 7-14491 | 1/1995 |
| GB | 2133489 A | 8/1983 | | JP | 7-57611 | 3/1995 |
| GB | 2233512 A | 1/1991 | | JP | 7-296713 | 11/1995 |
| JP | 55-166837 | 12/1980 | | JP | 8-31300 | 2/1996 |
| JP | 59-58734 | 4/1984 | | JP | 8-102244 | 4/1996 |
| JP | 59-81828 | 5/1984 | | JP | 8-129950 | 5/1996 |
| JP | 60-180382 | 9/1985 | | JP | 8-236004 | 9/1996 |
| JP | 62-172626 | 7/1987 | | JP | 9-35614 | 2/1997 |
| JP | 62-172627 | 7/1987 | | JP | 9-63454 | 3/1997 |
| JP | 62-172628 | 7/1987 | | JP | 9-129115 | 5/1997 |
| JP | 63-141233 | 6/1988 | | JP | 9-153328 | 6/1997 |
| JP | 10-53504 | 3/1989 | | JP | 10-50184 | 2/1998 |
| JP | 1-253263 | 10/1989 | | JP | 10-50190 | 2/1998 |
| JP | 2-43701 | 2/1990 | | JP | 10-50191 | 2/1998 |
| JP | 2-126530 | 5/1990 | | JP | 10-50198 | 2/1998 |
| JP | 2-301929 | 12/1990 | | JP | 10-79301 | 3/1998 |
| JP | 3-233825 | 10/1991 | | JP | 10-134695 | 5/1998 |
| JP | 4-33230 | 2/1992 | | JP | 10-162714 | 6/1998 |
| JP | 4-192237 | 7/1992 | | JP | 10-162715 | 6/1998 |
| JP | 4-242036 | 8/1992 | | JP | 10-241546 | 9/1998 |
| JP | 4-245127 | 9/1992 | | JP | 10-269927 | 10/1998 |
| JP | 4-245128 | 9/1992 | | JP | 10-302605 | 11/1998 |
| JP | 4-245129 | 9/1992 | | JP | 11-40040 | 2/1999 |
| JP | 4-245130 | 9/1992 | | JP | 11-126556 | 5/1999 |
| JP | 4-245131 | 9/1992 | | JP | 2000-12305 | 1/2000 |
| JP | 4-245132 | 9/1992 | | JP | 2000-235829 | 8/2000 |
| JP | 4-245133 | 9/1992 | | JP | 2003-234057 | 8/2003 |
| JP | 4-248221 | 9/1992 | | WO | WO83/01153 | 3/1983 |
| JP | 4-248222 | 9/1992 | | WO | WO88/03707 | 5/1988 |
| JP | 4-254302 | 9/1992 | | WO | WO90/00305 | 1/1990 |
| JP | 4-255627 | 9/1992 | | WO | WO91/14279 | 9/1991 |
| JP | 4-346409 | 12/1992 | | WO | WO00/19472 A1 | 6/2000 |
| JP | 5-36341 | 2/1993 | | | | |
| JP | 5-144368 | 6/1993 | | | | |

* cited by examiner

FUSE CARD SYSTEM FOR AUTOMOTIVE CIRCUIT PROTECTION

BACKGROUND

The present disclosure relates to the field of electrical protection. More particularly, the present disclosure relates to fuses and junction boxes for fuses.

Figure 1:
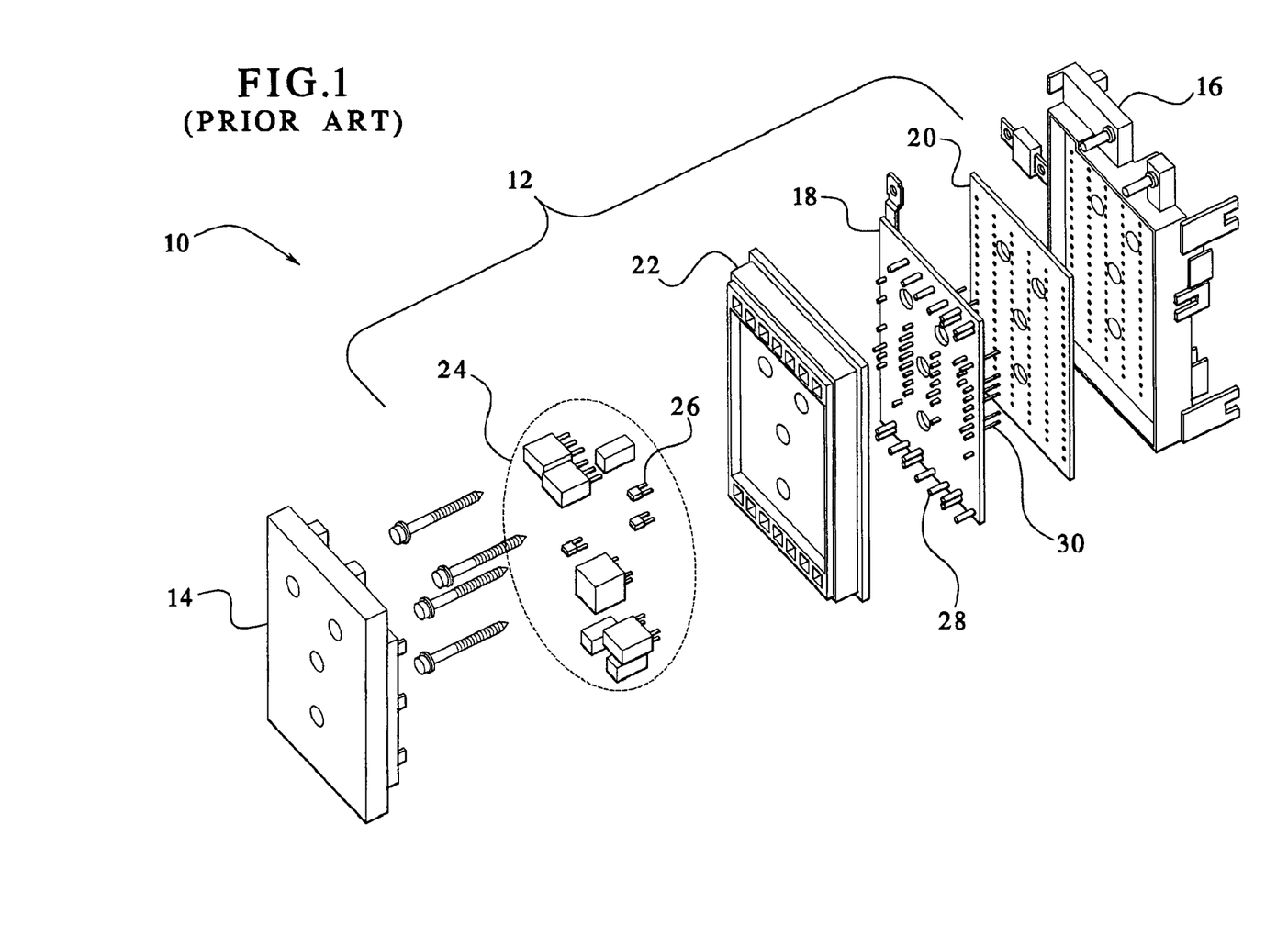
FIG. 1 is an exploded view of a known fuse junction box.

Known fuse blocks and junction boxes for automobiles are complicated. FIG. 1 illustrates a known junction box 10. Junction box 10 includes a number of primary components, such as a fuse block 12, a cover 14 and a lower housing 16. Fuse block 12 includes an upper press-fit layer 18 that mates with a lower press-fit layer 20. Upper and lower press-fit layers 18 and 20 mate with an upper housing 22, which collectively mate with the lower housing 16. The cover 14 mates with the upper housing 22.

Known fuse block 12 holds a number of electrical devices 24. For example, the electrical devices 24 can include JCASE® fuses and MINI® fuses provided by the assignee of this invention, mini and micro relays, and solid state relays. The fuses can be blade fuses.

Figure 2:
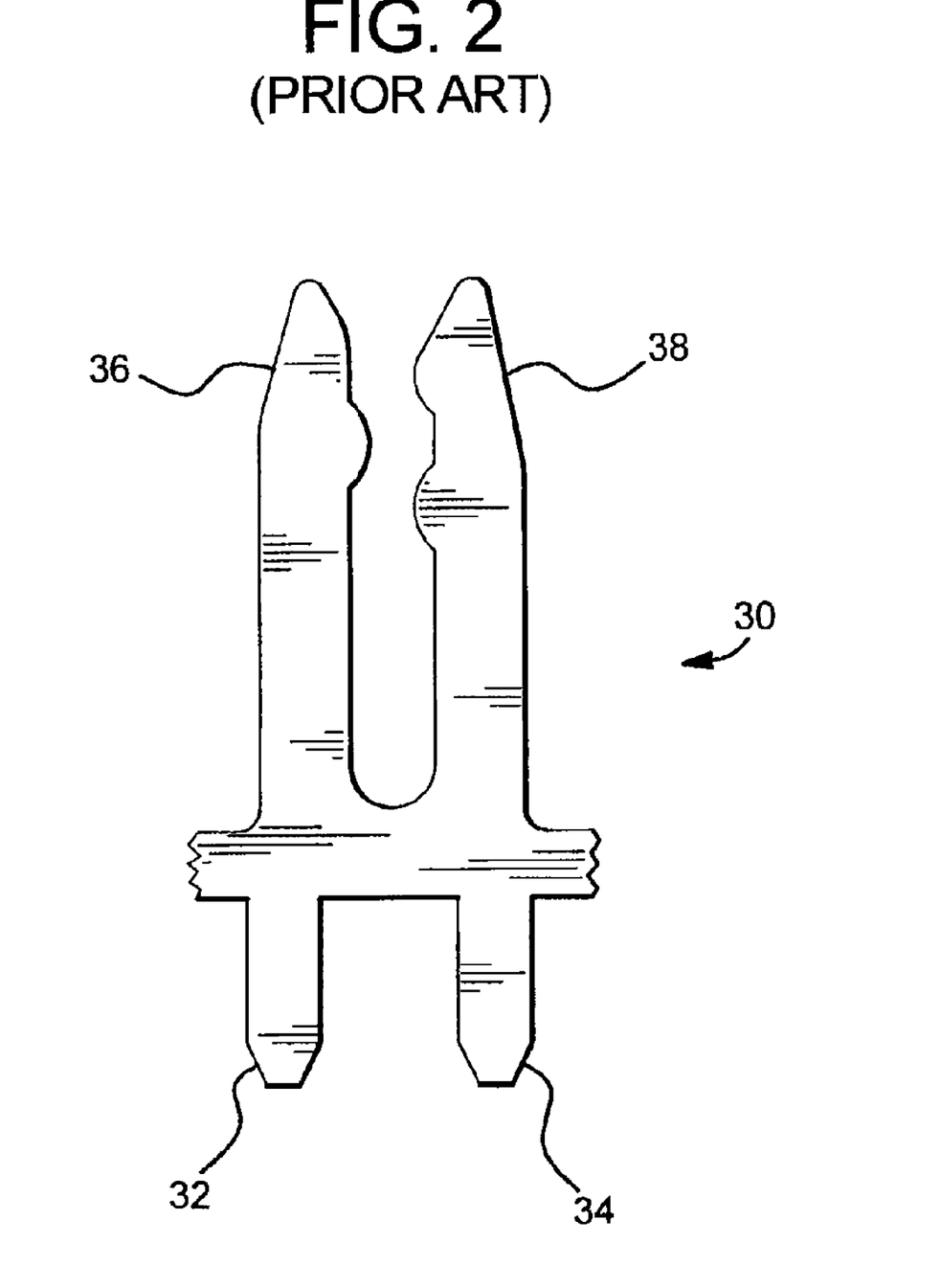
FIG. 2 is an elevation view of a known fuse carrying terminal, which is placed in the junction box of FIG. 1.

The fuses 26 are individually inserted frictionally into a pair projections 36 and 38, which are provided by a terminal 30 (FIG. 2). Terminal 30 is held fixed by upper and lower press-fit layers 18 and 20 as described below. The upper housing 22 defines apertures. Projections 36 and 38 of terminal 30 extend into the apertures, so that an operator may place a fuse 26, either initially or after an open fuse condition, into the pair of projections 36 and 38.

Referring to FIG. 2, a known "tuning fork" type terminal 30 is illustrated. Terminal 30 includes downwardly extending projections 32 and 34, which extend from upper press-fit layer 18, through lower press-fit layer 20, and through lower housing 16 for electrical connection to distribution wires within an automobile. Tuning fork terminal 30 also includes upwardly extending projections 36 and 38, which resemble a tuning fork, and which extend through apertures in upper press-fit layer 18. Projections 36 and 38 engage one of the blades of a male blade fuse 26 as described above.

It should be appreciated that known fuse block 12 of known junction box 10 includes a multitude of components that must press-fit together. The assembly requires many terminals, which add cost, complexity and weight.

The assembly of known fuse block 12 of known junction box 10 is relatively complicated. Some automobile manufacturers have accordingly tended to provide only one junction box 10 per vehicle. This creates a condition in which the load wires that run from the various electrical devices have to run all the way to the single junction box 10 regardless of the position of the load device in the vehicle. Extended lengths of load wires create weight, cost and increase the potential for short-circuiting.

A need therefore exists to provide a simplified automobile fuse block and junction box employing same.

SUMMARY

The present disclosure describes multiple embodiments for a substrate or printed circuit board-based junction box and substrate or board-based fuses operable with the junction box. The junction box and fuses are suitable for an automobile or other vehicle environment. It should be appreciated however that the fuses and junction box are expressly not limited to automotive or vehicle applications.

The junction box in one embodiment includes two or more boards, separated by spacers or other mechanical apparatuses. The junction box includes in one embodiment a distribution board and a power board. The distribution board includes a plurality of contacts or edge connectors, which are soldered, crimped or otherwise connected electrically to different load wires and circuits within an automobile for example. The load circuits are connected to the negative side of the battery through their loads, through the chassis of the vehicle. The power board includes a power plane or power conductor, which is connected ultimately to the positive side of the battery.

The distribution and power boards each define metallized slots that align with one another. The metallized slots include conductive spring clips or tabs, which connect electrically to distribution and power contacts, respectively, of an inserted substrate fuse and also serve to hold each substrate fuse removably in place. The metallized slots of the distribution board connect electrically to traces formed or etched on the distribution board. The traces on the distribution board in turn connect electrically to the contacts or edge connectors of the distribution board. In different embodiments described below, the traces can be integral with the remaining conductors, e.g., formed with either one or both the edge connectors and the metallized slots. The metallized slots in turn can have a component that is formed integrally with the distribution traces and another component that is connected or soldered to the components. The additional, separate portion of the metallized slots can be a single insertion clip, which contacts the fuse at multiple places. Alternatively, separate spring clips can be soldered to the metallized component of the slot to form the overall metallized slot.

The junction box further includes a back plate or housing wall, which is spaced apart from the power board a distance, and serves as a stop against which each fuse rests when inserted the proper distance into the junction box. This simplifies insertion of the fuses. The fuses can further define keys, which mate with corresponding grooves in the backplate or housing wall. The keys and corresponding grooves provide a rejection feature, which precludes a fuse having an improper rating from being inserted into that portion of the junction box.

The fuse contact clips or contact portions of the metallized slots in an embodiment provide a point or edge contact with the fuses, which allow the fuses to be inserted and removed from the junction box in two directions using roughly the same force. Pushing and pulling the fuse in or out of the junction box is accordingly not too difficult.

Distribution and power boards of the junction box in an embodiment are made of organic or inorganic materials, such as FR-4, ceramic, glass, plastic, polyimide, ceramic coated steel core substrate or other suitable relatively rigid electrically nonconductive material. Likewise, the fuse itself is substrate based and is made using any of the materials listed above.

In one primary embodiment, each fuse includes a single fuse element, a distribution contact and a power contact. In an embodiment, the contacts extend to both surfaces of the fuse substrate. The dual-sided contacts can be connected electrically using plated vias or bends that wrap around the fuse substrate. A fuse element is connected electrically to the distribution and power contacts. The fuse element includes a shape and size configured to achieve a desired $i^2R$ characteristic and current rating. In an embodiment, a Metcalf spot (e.g., lower melting temperature metal plating) is placed on an area of the fuse element at which it is desired for the element to open. The element is also coated or protected with a protective coating, such as a clear epoxy coating, which allows the element to be seen. The element can be formed integrally or separately from the distribution and power contacts.

The top portion of the fuse (e.g., the portion of the fuse seen by the user) includes a removal tool opening or aperture. Furthermore, that tip is coated with an, e.g. plastic, color-coated coating, which identifies the rating and type for the fuse. This portion of the fuse can also define an aperture configured to receive a fuse removal tool. In one embodiment, as described below, the fuse also includes open fuse indication, such as a light source (e.g., light emitting diode), which connects through indicating circuitry in electrical parallel with the distribution and ground contacts. The light source becomes illuminated when the fuse opens to direct an operator to the opened fuse for replacement.

In another primary embodiment, a multi-element fuse card is provided having multiple fuse elements formed on the surface of a substrate of the multi-element card. The fuse elements can be surface mounted onto pads formed on the multi-element card substrate or formed directly onto the multi-element card substrate using thin or thick film technologies. The substrate of the multi-element card can be of any types and materials described herein.

A bottom edge of the multi-element fuse card includes edge connectors. Each edge connector is connected electrically to one of the fuse elements formed or provided on the multi-element card substrate. The edge connectors each engage an edge-card connector mounted vertically on a separate load printed circuit board ("PCB"). The edge-card connectors are in turn connected electrically to loads within the vehicle needing protection.

The edge-card connectors and load PCB support the multi-element fuse card at its lower end. Additionally, a B+ power plane or PCB is provided above the PCB load or distribution plane. The fuse card is inserted through and supported by the B+ power plane. The B+ plane can be a stamped metal fret or be a PCB, as with the load PCB. The multi-element fuse card in one embodiment includes wider portions having contacts (common to the B+ sides of the fuses) that contact a connector formed by or on the B+ power plane. If the B+ power plane is a metal fret, the power plane connectors can be stamped into the fret. If the power plane includes a PCB, it provides connectors that are surface mounted or wave soldered to the power PCB.

A junction box in one embodiment includes one or a plurality of the multi-element fuse cards. The multi-element fuse card can include any of the alternatives discussed above for the single-element substrate fuse, such as color-coding, removal holes and or open-fuse indication.

In a further alternative embodiment, a substrate for having a conductive core (e.g., steel) and an insulative shell (e.g., ceramic) is used to form a multi-element fuse apparatus or a power B+ ground plane. To form the multi-element fuse apparatus, a portion of the insulative shell is etched away or not applied initially to expose the underlying metal. The underlying metal is used to receive power from a source, e.g., a car battery, and to distribute the power through one or more fuse element to a load or distribution contact. The size of the substrate is about the same size as a standard credit card, however, the substrate could alternatively be much smaller than that, for example, on the order or one square inch to protect five circuits.

The fuse elements and load contacts are formed onto the insulative substrate, e.g., via a thick film or ink screening process. The fuse elements and load contacts can be provided on a single side or both sides of the conductive core/insulative shell substrate. The fuse elements and any other exposed conductive areas that do not need to be connected to a structure of a junction box are covered with an insulative, e.g., glass or epoxy coating. Glass for example can be fired readily onto the primarily ceramic substrate.

To form a B+ power plate or plane, the inner conductive layer is slotted or formed initially with slots in a plurality of places. The slots to make electrical contact with a plurality of substrate fuses. The ceramic or insulative layer can be etched or formed initially around the slots as necessary to aid in the making of the electrical contact. The B+ power plate or plane receives power and supplies same to the individual fuses.

It is therefore an advantage of the present disclosure to provide an improved fuse junction box and fuse, which may be used in an automotive or other vehicle type application.

It is another advantage of the present disclosure to provide board or substrate based fuses and junction boxes.

It is yet another advantage of the present disclosure to provide a lower cost solution for automotive fuses and junction boxes.

It is further advantage of the present disclosure to provide an automotive fuse junction box and fuse, which is relatively simple to manufacture and assemble.

Moreover, it is an advantage of the present disclosure to provide a printed circuit board-based fuse junction box and fuse, which lend themselves to the addition of alternative circuitry and functionality, such as fuse indicating circuitry.

Further still, it is an advantage of the present disclosure to enable more fuses to be packed in smaller volumes, thereby reducing overall system costs.

Moreover, it is an advantage of the present disclosure to provide a substrate fuse, which is keyed and/or color-coded, so that it can be readily identified and also rejected if placed in an improper area of the fuse junction box.

Still further, it is an advantage of the present disclosure to provide a substrate fuse, which can be color-coded or marked readily to have easily discernable rating information.

An additional advantage of the present disclosure is to use a substrate for a multi-element fuse having a conductive core (e.g., steel) and an insulative shell (e.g., ceramic), which can be etched away or formed initially to expose the core in areas configured to receive power from a car battery for example.

Additional features and advantages are described herein, and will be apparent from, the following Detailed Description and the figures.

DETAILED DESCRIPTION

Figure 3:
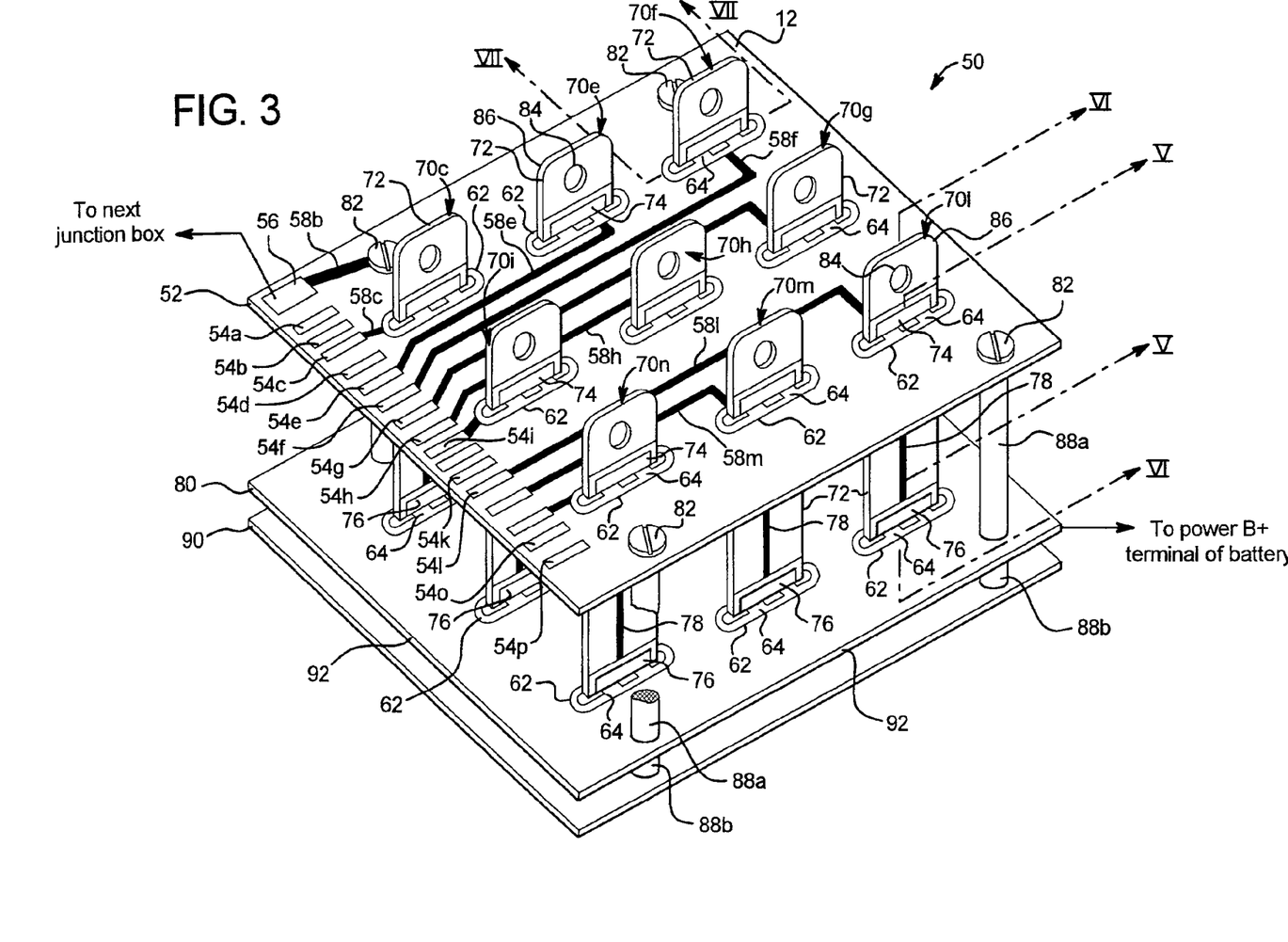
FIG. 3 is a perspective view of one embodiment for a junction box employing single-element substrate fuses of the present disclosure.

Referring now to the drawings and in particular to FIG. 3, junction box 50 illustrates one embodiment of a board-based junction box for a plurality of substrate fuses of the present disclosure. Junction box 50 includes a distribution board 52 and a B+ power board 80. Distribution board 52 and B+ power board 80 in an embodiment are printed circuit boards ("PCBs"), such as those made from organic or inorganic materials, such as an FR-4 material, a polyimide, a plastic material, a ceramic, ceramic coated metals (e.g., Elpor™ material by Heatron) glass or any other suitably rigid insulative material.

The current path for junction box 50 begins from the B+ terminal of the battery, extends to the B+ power board 80, through a substrate fuse 70 described in detail herein, to distribution board 52, to a load within the vehicle, to ground or chassis of the vehicle (connected to ground terminal of the battery).

Distribution board 52 includes multiple load contacts 54a to 54p. Load contacts 54 (referring collectively to contacts 54a to 54p or generally to one of contacts 54a to 54p connect electrically to different devices within the vehicle). A series contact 56 is also placed on distribution board 52 and is connected electrically ground 60. Series contract 56 enables distribution board 52 to power a second distribution board (not illustrated), which is placed in series with distribution board 52.

As illustrated, certain contacts 54 are connected electrically to corresponding board traces 58 (referring collectively to traces 58c, 58e, 58f, 58g, 58h, 58i, 58l, 58m and 58n or referred to generally to any one of the traces). Each of contacts 54 can be connected to a separate trace 58. In the illustrated embodiment, only certain of the contacts 54 connect electrically to a corresponding trace 58.

Traces 58 in turn connect electrically to metallized slots 62. Metallized slots 62 include metallized holding tabs 64, which connect electrically to distribution contacts 74 of respective substrate fuses 70c, 70e, 70f, 70g, 70h, 70i, 70l, 70m and 70n (referred to collectively as fuses 70 or generally as fuse 70). Metallized tabs 74 are shown in more detail below and serve additionally to crimp or physically hold a portion of fuse 70 in place. As seen, power B+ board 80 also has metallized slots 62 with metallized tabs 64, which connect electrically to power B+ contacts 76 of fuses 70 to hold a portion of the fuses firmly in place.

It should be appreciated that contacts 54, traces 58, metallized slots 62 and metallized mounting tabs 64 can each be part of a singular trace or metallization, which is placed on substrate 52 in a known matter, such as starting with a copper clad substrate 72 and etching the substrate to form the desired electrical pattern. For example, in one embodiment substrate 52 is copper clad. The shapes of the metallized slots 62 with tabs 64 are then made in substrate 52 via routing, laser cutting, or other suitable process. The vertical sides of tabs 74 are then metallized. Next the contacts 54, traces 58, slot and tab 64 configuration are etched, e.g., via a photolithographic process, from the solid copper cladding.

In an alternative embodiment, contacts 54 and associated traces 58 are formed integrally via the etching process. Traces 58 here contact an interface clip, which forms the metallized slots 62 and holding tabs 64. That is, the slot metallization 62 and tabs 64 are not part of the integral trace 58 but instead connect electrically to one of the traces. In a further alternative embodiment, contacts 54 can be provided separately from traces 58, wherein traces 58 are made to come into electrical contact with respective contacts 54. Similarly, series contact 56 can be integral with or provided separately from series trace 58q, which is connected electrically via a conductive path 82 to the power plane of power B+ board 80.

Figure 5:
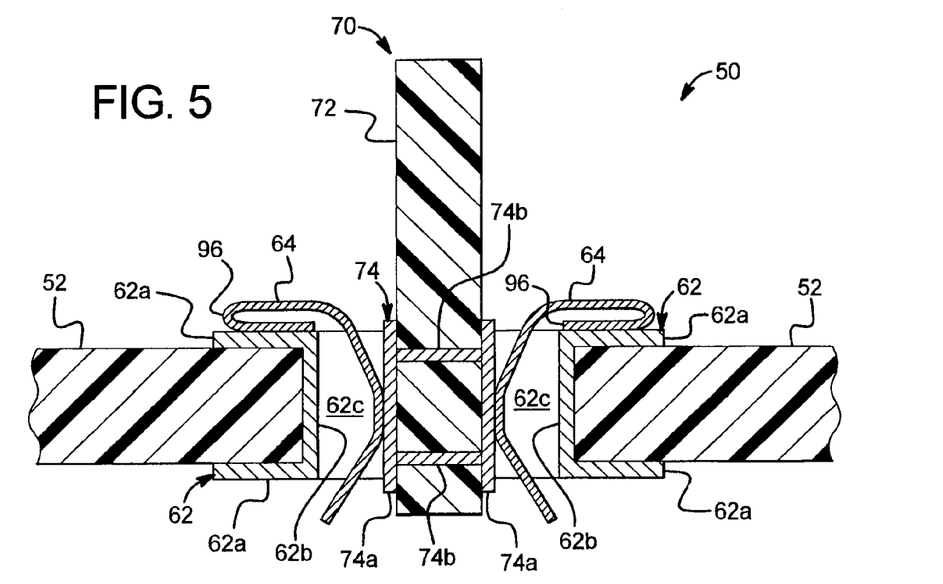
FIG. 5 is a sectioned elevation view taken through line V-V of FIG. 3.
Figure 6:
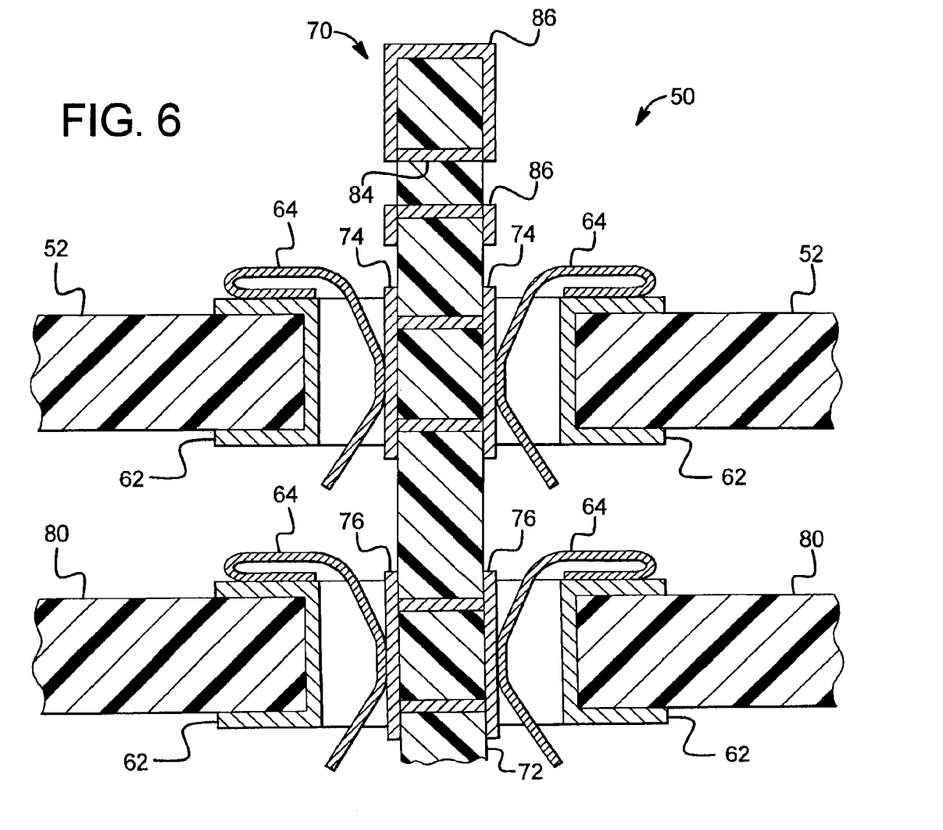
FIG. 6 is a sectioned elevation view taken through line VI-VI of FIG. 3.

FIGS. 5 and 6 illustrate one suitable embodiment for slot metallization 62 and mounting tabs 64. Here, the slot is routed as a straight slot. Slot metallization 62 is formed via the etching process integrally with mating traces 58. Tabs 64 are provided as separate components, which clip onto or are soldered to metallizations 62. FIGS. 5 and 6 are discussed in more detail below. Likewise, fuses 70 are discussed in detail below in connection with FIGS. 8 to 10. As seen in FIG. 3, fuses 70 generally include a distribution contact 74 and a power B+ contact 76, a fuse element 78, a hole 84 for a removal tool to remove fuse 70 after it has opened, and a color-coded coating or marking 86, which helps the user readily identify the type and rating of a particular fuse 70. Each of these components is described in more detail below.

As discussed above, metallic screws 82 are inserted through distribution board 52. Screws 82 or conductors extend through spacers 88a and 88b. Screws or conductors 82 also extend through power B+ board 80. Spacers 88a space apart distribution board 52 and power B+ board 80 a distance set by distribution contacts 74 and power B+ contacts 76 of fuses 70. Spacers 88b in turn separate power B+ board 80 from a back plate 90. Back plate 90 can likewise be an FR-4 material, plastic or other suitable nonconductive material. Screws 82 and spacers 88b are alternatively eliminated by features molded in the plastic housing that holds the entire junction box together. Fuse box 50 however may include at least one conductor 82 running from power B+ board to series trace 58q, from which series contact 56 can power another junction box 50.

Back plate 90 stops fuse 70 after it has been inserted into box 50 to its required position. Back plate 90 makes the insertion fuses 70 easier for the user, who pushes fuse 70 into block 50 until it cannot be inserted any further, instead of having to look to confirm that distribution contact 74 is in proper electrical communication with metallized tabs 64 of metallized slot 62. Back plate 90 is alternatively part of a molded plastic enclosure into which junction box 50 is placed. That is, back plate 90 does not have to be an additional board and can instead be a wall of a housing for the junction box 50. As discussed below, Back plate 90 can include an additional holding and reject feature apparatus. Spacers 88a and 88b in one embodiment are plastic spacers.

The slot metallizations 62 of ground board 80 in an embodiment communicate electrically with a power B+ plane 92 which in an embodiment is etched onto the underside of power B+ board 80. Power B+ plane 92 is connected electrically to the B+ terminal of the automobile battery as seen in FIG. 3.

The illustrated embodiment shows a junction box 50, which is configured for nine fuses 70. It should be appreciated however that junction box 50 can be expanded or downsized to house any suitable number of substrate fuses 70. Junction box 50 can be made efficiently, enabling multiple boxes to be placed in convenient places within an automobile, for example. This can reduce the amount of wiring needed to connect the box to the load.

Figure 4:
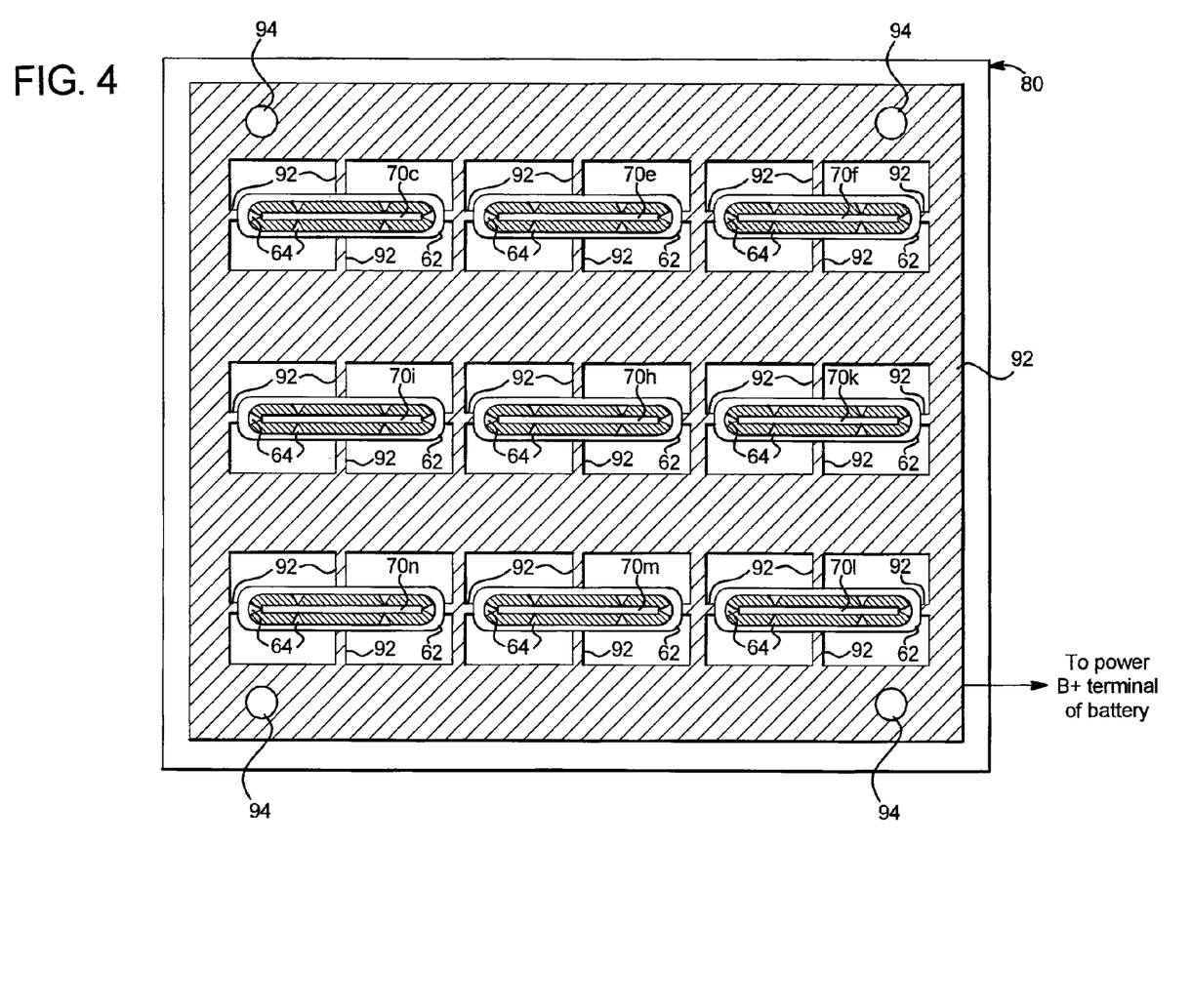
FIG. 4 is a bottom plan view of one embodiment of a power ground board for the junction box employing single-element substrate fuses of the present disclosure.

Referring now to FIG. 4, power B+ board 80 is illustrated from the bottom with respect to the orientation of junction box 50 of FIG. 3. This view illustrates power B+ plane 92 referenced above in connection with FIG. 3. As illustrated, power B+ plane 92 connects to the positive side of the automobile battery. Power B+ plane 92 also extends to slot metallizations 62, which in turn communicate electrically with conductive holding tabs 64. As described above in connection with distribution board 52, power B+ plane 92 can be an integrally etched trace along with slot metallizations 62 and metallized holding tabs 64. Alternately, slot metallization 62 and power B+ plane 92 are integrally etched traces, which connect electrically to conductive tabs 64. In yet another alternative embodiment, slot metallizations 62 and conductive holding tabs 64 are provided as a separate interference clip, which connect electrically to etched power B+ plane 92. As illustrated, power B+ plane 92 connects electrically to slot metallization 62 in a plurality of places. As also seen, metallized tabs 64 can be positioned to contact the broad side surfaces of fuse 70 and also to contact the thin edges of the fuses. Power B+ board 80 also includes or defines slot receiving holes 94, which receive screws 82 that hold power B+ board 80 to distribution board 52.

Referring now to FIGS. 5 and 6, one suitable embodiment for slot metallizations 62 and conductive holding tabs 64 is illustrated. FIG. 5 illustrates a sectioned portion of distribution board 52. Distribution board 52 includes or defines a metallized slot 62. Slot metallization 62 in the illustrated embodiment is a combination including etched top and bottom portions 62a communicating with metallized sidewall 62b. In this embodiment, the aperture 62c made in distribution substrate 52 is a routed, stamped, laser cut or otherwise suitably formed to be an oblong slot, with semicircular ends and straight sides. It should be appreciated however that the ends of slot 62 do not have to be semicircular and can have any suitable shape that allows room for the spring clip 64 and substrate fuse 70 to pass through. Metallic spring clips 64 enable aperture 62c to be made more simply. If metallic spring clips 64 are not used, and instead the shape of metallic tabs 64 is defined by the slotting process, the aperture 62c will have steps and its shape will be more complicated. Here, however, a separate spring clip is not needed.

In the illustrated embodiment, the metallic spring clips 64 are soldered to upper portions 62a of metallized slots 62 via soldered joints 69. A suitable conductive adhesive or mechanical fastener may be used alternatively or additionally. Although not illustrated, spring clips 64 can extend to inner side surfaces 62b and lower portions 62a of metallized slots 62 and be soldered or adhered to those surfaces additionally. In a further alternative embodiment, metallic spring clips 64 are formed integrally with metallizations 62a and 62b of metallized slots 62, providing an overall metallic insert 62 having each of clips 64 used for the metallized slot.

As seen in FIG. 5, substrate fuse 70 when inserted makes mechanical and electrical connection with spring clips 64, spreading the spring clips apart, such that spring clips 64 apply a compressive holding force to fuse 70. Spring clips 64 make electrical connection with pads 74a of distribution contact 74. As seen, left and right pads of 74a are connected electrically through insulative substrate 72 using metallized vias 74b. Distribution contact 74 is accordingly two sided and makes multiple electrical connections with multiple metallic clips 64 or multiple portions of a single metallic insert 62. It should be appreciated that power B+ contact 76 in one embodiment is made in the same way as described in distribution contact 74.

FIG. 6 illustrates a section view of both distribution board 52 and power B+ board 80. Distribution and power B+ boards 52 and 80 are arranged parallel to each other. Power B+ board 80 provides a corresponding metallized slot 62, which is in alignment with the slot 62 on distribution board 50. In this way, each protected circuit connected to distribution board 52 has a corresponding metallized slot 62 with multiple metallized clips 64 or a single interference clip 62 forming the metallized slot and a fused connection to ground via a similar metallized slot in power B+ board 80. Alternatively, the metallized slots are made purely via etching and plating as discussed.

FIG. 6 also illustrates tool removal aperture 84, which allows an open fuse 70 to be removed readily from junction box 50 using a hook type tool for example. Further, the top of fuse 70 is marked with a color coating or other marking 86, which provides rating identification, branding, product information, e.g., product number and insertion instruction information, such as directional information, for example. Any of this information is placed alternatively directly onto substrate 72. The color coating 86 can be a colored plastic coating, such as a soft, easily applicable and self-adhering plastic.

In one embodiment, metallized spring clips 64 are formed such that they have a point or edged contact with contacts 74 and 76. For example, the edge could be a rounded edge. This configuration provides for an at least substantially equal insertion and removal force, which allows fuse 70 to be pulled relatively easily from junction box 50 in an opposite direction from which it was inserted. Insertion tool and removal aperture 84 also help with the removal of fuse 70.

Figure 7:
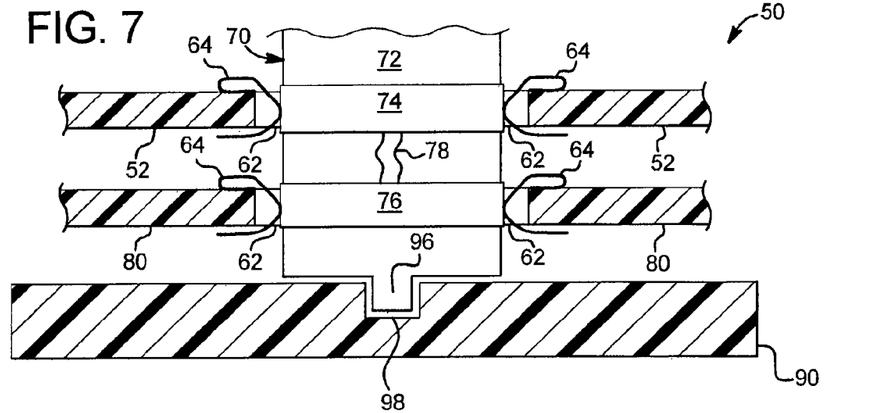
FIG. 7 is a sectioned elevation view taken through line VII-VII of FIG. 3.

Referring now to FIG. 7, a further alternative section view of fuse block 50 is illustrated. FIG. 7 illustrates sections of distribution board 52, power B+ board 80 and back plate or housing wall 90. FIG. 7 illustrates fuse 70 along its broadside having an alternative distribution contact 74 and an alternative power B+ contact 76 connected via fuse element 78. Contacts 74 and 76 have an alternative configuration in which they are plated around the thin substrate 72 in a band-like manner. Metallized slots 62 include metallic spring clips 64, which make electrical contact with contacts 74 and 76 along the thin edges of fuse 70. In this manner, contacts 74 and 76 are configured as metallic bands that extend around substrate 72 of fuse 70. Edge contacts 64 in one embodiment are part of a single inserted interface clip forming metallized slot 62. Alternatively, spring clips 64 are separate from other spring clips 64 that mate with contacts 74 and 76 along the broad face of substrate 72 of fuse 70.

One alternative embodiment illustrated in FIG. 7 is the formation of a key 96 in substrate 72 of fuse 70. Key 96 is configured to mate only with corresponding grooves or inlets 98 formed in back plate or housing wall 90. The rejection feature of key 96 and mating groove 98 ensures that only a fuse 70 having a fuse element 78 of a particular rating or within a group of ratings can be fitted into junction box 50. Key 96 for example can include multiple key extensions, which are spaced apart so as to fit only into a correspondingly spaced apart set of grooves 98. In one embodiment, the multiple extensions and grooves 98 are symmetrical such that fuse 70 can be gripped either way to be inserted through multiple boards 52 and 80 of metallized slots 62.

Figure 8:
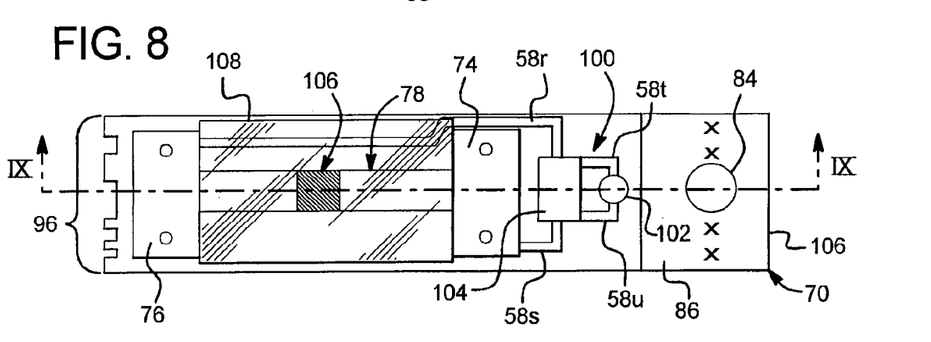
FIG. 8 is a top plan view of one embodiment of a single-element substrate fuse of the present disclosure.
Figure 9:
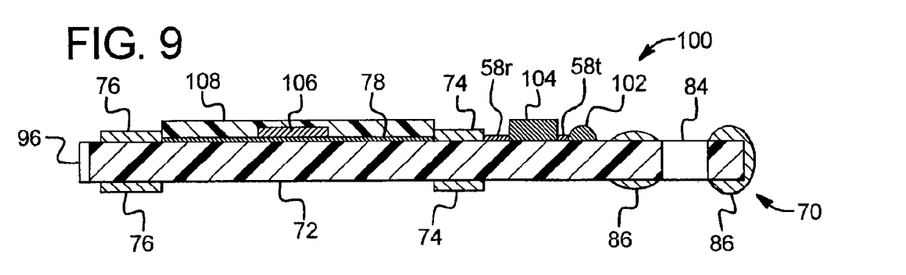
FIG. 9 is a sectioned elevation view taken through line IX-IX of FIG. 8.
Figure 10:
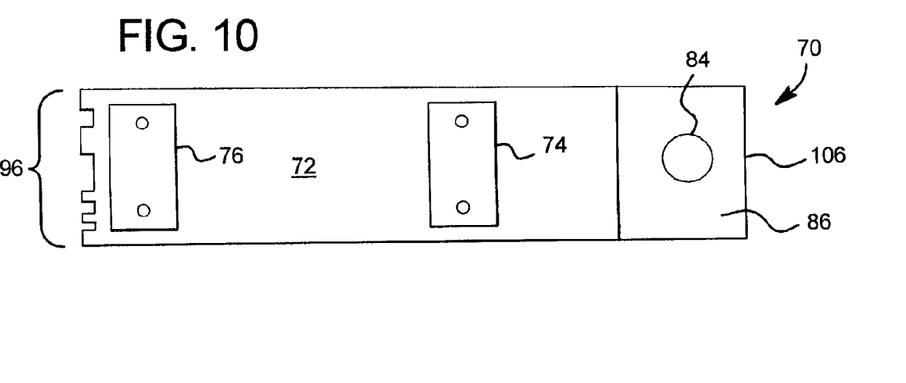
FIG. 10 is a bottom plan view of one embodiment of a single-element substrate fuse of the present disclosure.

Referring now to FIGS. 8 to 10, one embodiment of fuse 70 is shown from top, sectioned side and bottom views, respectively. Many of its components have been discussed previously, such as substrate 72, distribution contact 74 (which extends to both sides of substrate 72), power B+ contact 76 (which extends to both sides of substrate 72), fuse element 78 connected electrically between contacts 74 and 76, fuse removal aperture 84, color-coded coating or marking 86 and key 96. Each of contacts 74 and 76 and element 78 is formed directly on substrate 72 in one embodiment via a plating and etching process. Alternatively, element 78 can be surface mounted, e.g., via reflow soldering, to a separate contact formed on substrate 72, and so as to be in electrical communication with contacts 74 and 76. In either case, element 78 is sized (width and height) and shaped to provide desired current rating and $i^2R$ opening characteristics. Different widths of projections for key 96 are shown. These would correspond to different widths of grooves in back plates or housing wall 90. The projection pattern can be asymmetric or symmetrical.

Fuse element 78 includes a Metcalf spot or dissimilar metal spot 106. Spot 106 in general includes a metal having a lower melting temperature than that of fuse element 78. For example, contacts 74 and 76 and element 78 can be copper, which is etched away from an initially plated substrate 72. Metcalf spot or dissimilar metal stop 106 can than be any one or more of nickel, indium, silver and tin. Tin in particular diffuses quickly into copper, is relatively cheap and is readily applied using common techniques. Metcalf spot 106 enables fuse element 78 to open at a particular spot, e.g., near the middle of element 78, which is desirable. It should be appreciated that element 78 can have any suitable shape, such as a serpentine, curved, stepped or straight shape. The width and/or thickness of element 78 is controlled so that fuse 70 has the desired current rating and $i^2R$ opening characteristics.

Fuse 70 also includes a protective coating 108, which covers element 78. Coating 108 in an embodiment is a suitable epoxy material, such as a solder mask manufactured by Electra Polymers, Roughway Mill, Tonbridge, Kent, United Kingdom. Coating 108 helps suppress the energy released when fuse element 78 opens and protects the element from mechanical damage and environmental exposure. Coating 108 is clear in one embodiment so that element 78 can be seen.

In the illustrated embodiment, fuse 70 includes an open fuse indicator 100. Opened fused indicator 100 includes a light source 102, such as a light emitting diode ("LED"), which communicates electrically with indicating circuitry 104 via traces 58*t* and 58*u*. Indicating circuitry 104 in turn communicates electrically with contacts 74 and 76 in a parallel electrical relationship with fuse element 78. Indicating circuitry 104 in an embodiment includes a pair of diodes and a resistor, which are sized such that when fuse element 78 opens, enough current flows through circuitry 104 to illuminate LED 102. In this manner, a user can readily discern which fuse 70 in junction box 50 has opened. It should be appreciated that light source 102 can be placed in any suitable visible position with respect to fuse 70, such as along an edge 106, which is the top of fuse 70 when inserted into junction box 50. Indicating circuitry 104 in one embodiment is the same circuitry used in Blo and Glo™ and Smart Glo™ fuses, marketed by the assignee of the present disclosure.

Figure 11:
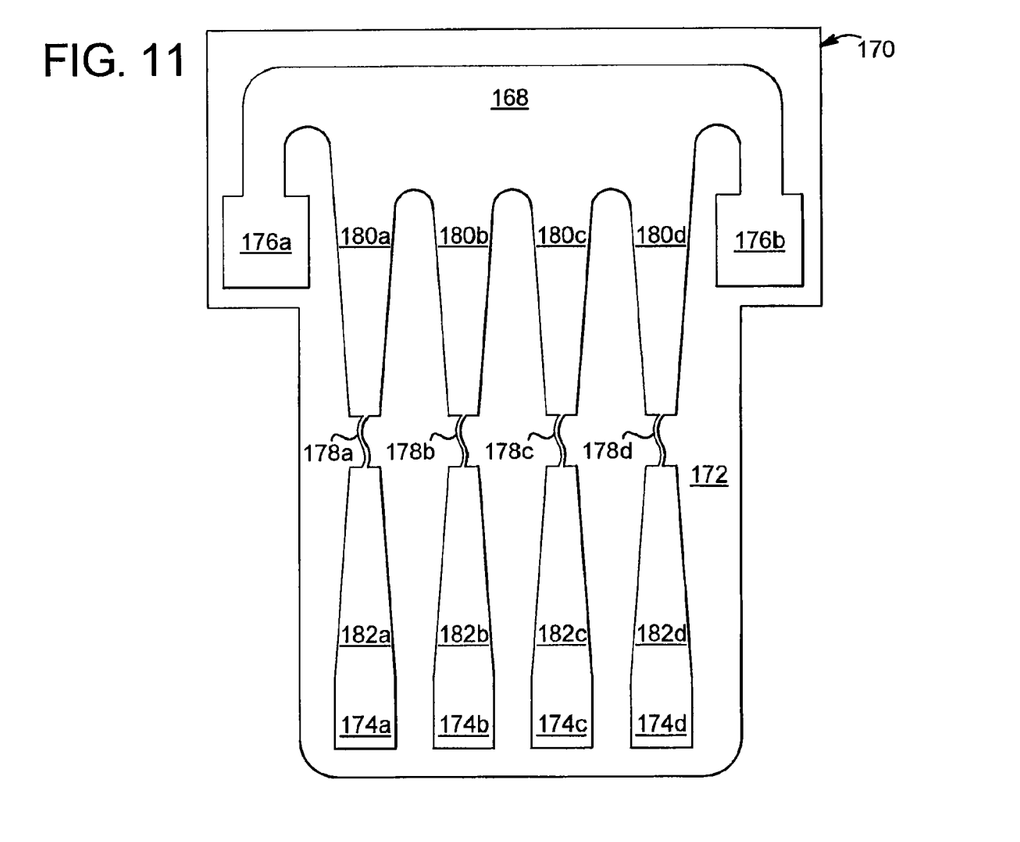
FIG. 11 is a front elevation view of one embodiment of a multi-element fuse apparatus of the present disclosure.
Figure 12:
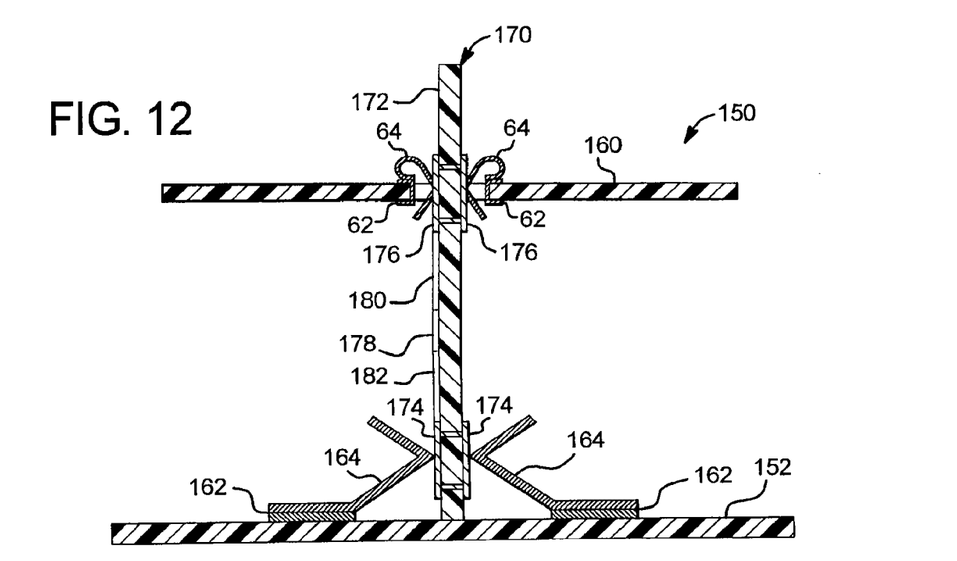
FIG. 12 is a side elevation view of the multi-element fuse apparatus of FIG. 11 mounted for operation.

Referring now to FIGS. 11 and 12, an alternative substrate fuse apparatus is illustrated by fuse apparatus 170. FIG. 11 illustrates substrate fuse 170. FIG. 12 illustrates a junction box assembly 150 employing fuse 170 of FIG. 11. The primary difference between fuse apparatus 170 and fuse 70 discussed above is the provision of multiple fuse elements 178*a* to 178*d* (referred to herein collectively as fuse elements 178 and generally, individually as fuse element 178). Each fuse element 178*a* to 178*d* communicates electrically with a separate load or distribution contact 174*a* to 174*d*, respectively, via load or distribution leads 182*a* to 182*d*. On the other end, each fuse element 178*a* to 178*d* communicates electrically with a power B+ conductor 168 via power B+ leads 180*a* to 180*d*, respectively. Power B+ conductor 168 in turn communicates electrically with power B+ contacts 176*a* and 176*b*. As illustrated, substrate 172 of substrate fuse apparatus 170 widens at the portion carrying power B+ contacts 176*a* and 176*b*. The widened portion helps the operator to know which end of the fuse should be grasped, and which end should be inserted through spring clips 64 of power B+ plane 160 to spring clips 164 of distribution plane 152.

Substrate 172 of fuse apparatus 170, power B+ plane 160 and distribution plane 152 can be of any of the materials described above for substrate 72 of fuses 70, distribution board 52, and/or power B+ board 80. Fuse elements 178*a* to 178*d* can be surface mounted to substrate 172, e.g., via a reflow soldering process. Alternatively, fuse elements 178*a* to 178*d*, are formed directly on substrate 172 via a plating and etching process, as described above for the other fuse elements and board-based conductors. Fuse elements 178*a* to 178*d* can also be printed on the substrate using thick-film inks. Likewise, power B+ leads 180 (referring collectively to leads 180*a* to 180*d* or generally to any of those leads) and load leads 182 (referring collectively to leads 182*a* and 182*d* or generally to any of those leads), as well as contacts 176*a*, 176*b* and 174*a* to 174*d* can be soldered to or formed directly on substrate 172. Although four elements 178*a* to 178*d* are shown, multi-element substrate fuse apparatus 170 can have any suitable number of elements and associated leads and load contacts 174.

Although not illustrated, fuse apparatus 170 can employ one or more card removal aperture 84, a color-coded coating or marking 86 and/or open fuse indicator 100 including light source 102 and associated circuitry 104 described above. It is contemplated to size the fuse elements to be the same (width and height), so as to provide a card having like rated fuses, or to size elements 178 differently, such that fuse apparatus 170 has fuses of different ratings. Depending on the rating configuration, the color coating or marking 86 can be a single color or marking representing that each fuse element has the same rating or have multiple colors or markings to indicate different ratings of different elements. Coating or marking 86 can also provide an insulative area for the user to grasp and insert or remove fuse apparatus 170.

Any of the fuse elements 178 can have a Metcalf spot or dissimilar metal as described above for fuse element 78 of fuse 70. Any of the fuse elements herein and associated leads and traces can be of any desirable metal, such as copper, tin, silver, zinc or any suitable combination or alloy thereof.

FIG. 12 shows fuse apparatus 170 inserted into a junction box 150, which includes a power B+ plane 160 and a distribution plane 152. In general, the power B+ and distribution planes of junction box 150 are reversed in order from top to bottom from the order shown in connection with junction box 50. Here, distribution plane 152 lies below power B+ plane 160, while in junction box 50 distribution plane 52 lies above power B+ plane 80. Suitable materials for power B+ plane 160 and distribution plane 152 have been discussed.

Additionally or alternatively, power B+ plane 160 can be a stamped metal fret. In such a case, metallizations 62 and separate spring clips 64 as discussed above for fuse 70 are not necessary. Instead, the ground connectors are formed integrally with the stamped fret. Otherwise, as illustrated, metallized slots 62 and mounting tabs 64 can be used in any of the configurations described above for junction box 50. Here, metallized tab or spring clip 64 contacts one of the ground contacts 176 of multi-element fuse apparatus 170. Although not illustrated, a separate metallized slot and spring contact 64 is provided and connects electrically to each of the other of the power B+ contacts 176a and 176b shown for multi-element fuse apparatus 170. Spring clips 64 hold fuse apparatus 170 firmly in place at the top of the fuse card and can be surface mounted or wave soldered to metallized slots for added rigidity. Alternatively, clips 64 are formed integrally with slots 62 as discussed above.

As illustrated, power B+ contacts 176 and distribution contacts 174 are plated or formed on both sides of fuse apparatus 170. The two platings or formations are then connected electrically via plated vias as discussed above with fuse 70.

FIG. 12 illustrates that fuse apparatus 170 when fully inserted is abutted against load distribution plane 152. This configuration makes proper insertion of multi-element fuse apparatus 170 easy. Surface contacts 162 are formed on distribution plane 152 via any of the methods discussed here. Surface mounted spring clips or connectors 164 are reflow soldered onto contacts 162 in one embodiment. Each load connector 164 makes electrically connection with one of the load or distribution contacts 174 of fuse apparatus 170. In an alternative embodiment, load connector 164 is wave or through-hole soldered into a respective substrate of distribution plane 152 for rigidity. Load connector 164 is connected electrically to an edge connector (not illustrated) located along (e.g., at an edge of) distribution plane 152. The edge connector is in turn soldered or connected to a lead running to an electrical device within the vehicle.

While assembly 150 shows a single multi-element fuse apparatus 170 in operation with ground and distribution planes 160 and 152, it is expressly contemplated to have multiple multi-element cards operable with planes 160 and 152. For example, cards having elements with different ratings can be provided. Each card has a respective spring clip 64 and 164 connector arrangement. Distribution plane 152 in turn can have a respective set of load contacts for each multi-element card. The same B+ power plane 160 can be used for each multi-element card. Further, distribution plane can include a series contact (not illustrated), similar to series contact 56 of distribution board 52 of junction box 50 shown above. Power B+ plane 160 is placed in electrical communication with the series contact. The series contact can in turn be placed in electrical contact with power B+ planes 160 of other junction boxes 150 to power those other junction boxes.

Figure 13:
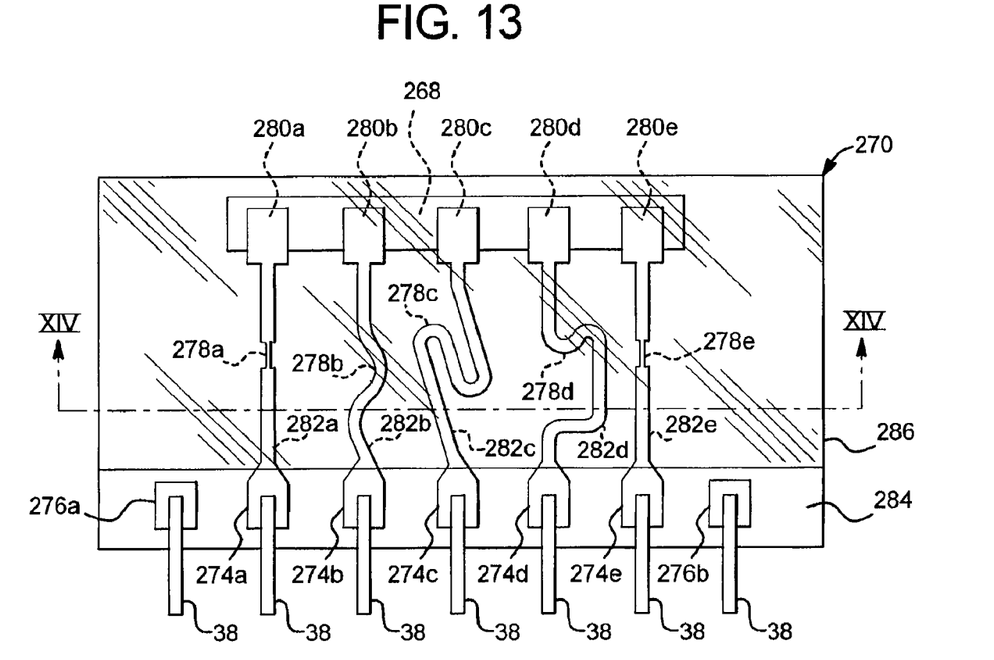
FIG. 13 is a front elevation view of another embodiment of a multi-element fuse apparatus of the present disclosure.
Figure 14:
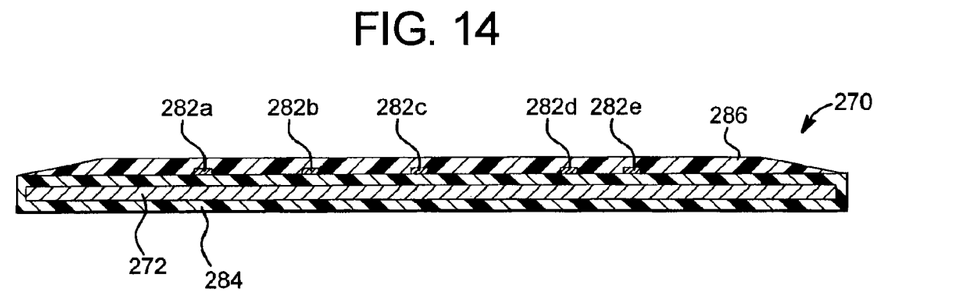
FIG. 14 is a sectioned side view of the multi-element fuse apparatus of FIG. 13 taken along line XIV-XIV of FIG. 13.

Referring now to FIGS. 13 and 14, a further alternative substrate fuse apparatus is illustrated by fuse apparatus 270. The primary difference between fuse apparatus 170 and 270 is the construction multi-element fuse apparatus 270. Here, the substrate includes a metal, e.g., steel, stainless steel or aluminum (or any other suitable material) core 272, which is coated with an insulative, e.g., ceramic, coating 284. Fuse apparatus 270 in one embodiment has a height and length of about one inch by one and one half inch (3 cm×4 cm). Metal core can have a thickness of about 0.025 inch in one embodiment. Coating 284 can have a thickness of about 0.006 inch in one embodiment. One such substrate is made by Heatron, Inc., Leavenworth, Kans., and is called ELPOR® ceramic coated steel. The substrate is relatively inexpensive and exhibits good thermal properties due to the heat sinking ability of the metal, e.g., steel core 272. The substrate is also rigid and strong.

Fuse apparatus 270 includes multiple fuse elements 278a to 278e (referred to herein collectively as fuse elements 278 and individually, generally as fuse element 278). Although five elements 278 are shown, multi-element substrate fuse apparatus 270 can have any suitable number of elements and associated leads and load contacts 274. Fuse elements 278 can range in rating from 0.5 Amp to about 50 Amps, e.g., can have any standard automotive fuse rating.

Each fuse element 278a to 278e communicates electrically with a separate load or distribution contact 274a to 274e (referred to herein collectively as distribution contacts 274 and individually, generally as distribution contact 274), respectively, via load or distribution leads 282a to 282e (referred to herein collectively as distribution leads 282 and individually, generally as distribution lead 282).

On the other end, each fuse element 278a to 278e communicates electrically with a power B+ conductor 268 via power B+ pads/leads 280a to 280e (referred to herein collectively as power B+ pads/leads 280 and individually, generally as power B+ pad/lead 280), respectively. Power B+ conductor 268 in turn communicates electrically with (i.e., is part of the same piece of metal or steel) power B+ contacts 276a and 276b.

Ceramic substrate 284 in one embodiment is printed (e.g., via a thick film process) to have exposed areas of metal in desired places to form contacts 276a and 276b and power B+ conductor 268. The ceramic coated metal is then fixed. Alternatively, ceramic 284 is etched away from a fired stock in desired locations to expose metal, e.g., steel, core 272 to form power B+ contacts 276a and 276b and power B+ conductor 268. It should be appreciated that a varying amount of pads/leads 280 could also be formed via the metal exposed by initially forming or etching away the insulative, e.g., ceramic, substrate 284.

In the illustrated embodiment, fuse elements 278, pads/leads 280, distribution leads 282 and load or distribution contacts 274 are formed together, continuously (e.g., silver, copper, or tin) via a surface mount process, such as thick-film printing, onto the insulative, e.g., ceramic, substrate 284. The printing process can have multiple passes to build elements 278, pads/leads 280 and leads 282 to a desired thickness. The metallized ceramic coated metal is then fired again. It is also contemplated to apply vary thin layers of metal (e.g., silver, copper or tin) to form elements 278 leads/pads 280, etc., e.g., via a photolithographic process to produce fuses having ratings of fractions of an Amp, e.g., for move advanced electronics and signal level voltages.

To enable (e.g., copper) pads/leads 280 to be applied properly, it may be necessary to plate power B+ conductor 268 initially (at least in its contact areas) with a desirable metal such as copper or silver. The initial plating reduces or eliminates the step-up in height due to the thickness of the ceramic. Again, any of conductors 280, 278, 282 and 274 can be made in multiple screen or ink printing passes. In one embodiment, the partially assembled fuse apparatus is fired after each pass or is dried after each pass and fired at once to metallically combine all the layers.

Also, power B+ contacts 176a and 176b are in one embodiment plated with a suitable metal, e.g., silver, so that the bare steel does not come into contact with projections 36 and 38 of the turning fork terminals or other contacting connector apparatus. In an alternative embodiment, power B+ contacts 176a and 176b are printed with a metal ink to eliminate the differences in height and to cover the steel. The silver builds the thickness of contacts 276a and 276b, prevents corrosion and enhances the electrical characteristics of fuse apparatus 270. Further, the size of contact areas 276a and 276b are made as small as possible to a size needed for proper contact with terminals, clips or other connectors.

In the illustrated embodiment, load or distribution contacts 274a to 274e and power B+ contacts 276a and 276b are mated with projections 36 and 38 of the "tuning fork" type terminals 30 described above. Alternatively, contacts 274a to 274e and contacts 276a and 276b are mated to spring clips or connectors, such as connectors 64 and 164 discussed above.

An insulative, e.g., glass or epoxy coating 286 is placed, e.g., fired or sintered, onto the substrate of fuse apparatus 270. Insulative coating 286 covers as much of fuse apparatus 270 as possible but leaves load or distribution contacts 274a to 274e and power B+ contacts 276a and 276b (referred to herein collectively as contacts 276 or generally, individually as contact 276) exposed for mounting.

In the illustrated embodiment, power B+ contacts 276 and distribution contacts 274 are plated or formed onto one side of fuse apparatus 270 only. Here, only that side needs insulative layer 286. In one alternative embodiment, distribution contacts 274 extend around the bottom of ceramic layer 284 and up onto the back side of fuse apparatus 270, so that the tuning fork terminals or other mating connectors contact distribution contacts 274 in two places. Likewise, ceramic layer 284 can be preformed or etched on both sides of fuse apparatus 270 to make power B+ contacts 276 two-sided, so that the tuning fork terminals or other connectors contact power B+ contacts 276 in two places. Here, insulative coating 286 still only has to cover one side of fuse apparatus 270, so that two-sided contacts 274 and 276 remain exposed.

In another alternative embodiment, fuse elements 278, pads 280, pads/leads 282 and load or distribution contacts 274 are formed on both sides of fuse apparatus 270, increasing space usage efficiency. Metal or steel core 272 serves as the power B+ conductor 268 and power B+ contacts 276a and 276b for the fuses on both sides of fuse apparatus 270. Here, insulative coating 286 covers fuse elements 278, pads 280, and pads/leads 282 of the fuses on both sides of fuse apparatus 270, but allows contacts 274 and 276 to remain exposed on both sides. Here also, clips or connectors, such as apparatuses 64 or 164 described above are placed on both sides of fuse apparatus 270 for separate, single-sided contact, and so that each fuse element 278 communicates with a unique connector 64 or 164.

It is also contemplated to provide multiple insulative or ceramic layers 284. Here, a first layer of fuse element 278 (e.g., having layer ratings) is coated with an insulative layer 284. A second layer of fuse elements 278 (e.g., via thin film process to yield smaller ratings) is applied to the second insulation layer 284 and so on. The final layer receives protective coating 286. A same bus-bar core 272 is used for each layer of fuse elements 278. Or, bus-bar core 272 can be split, for any embodiment described herein, into multiple bus-bars to receive, e.g., power at different voltages.

Although not illustrated, fuse apparatus 270 can employ one or more card removal aperture 84, a color-coded coating or marking layer 86 and/or open fuse indicator 100 including light source 102 and associated circuitry 104 described above. It is contemplated to size fuse elements 278 to be the same (width and height), so as to provide a fuse apparatus or fuse card having like rated fuses, or to size elements 278 differently, such that fuse apparatus or fuse card 270 has fuses of different ratings. Depending on the rating configuration, the color or marking layer 86 can include a single color or marking representing that each fuse element has the same rating or have multiple colors or markings to indicate different ratings of different elements. Color or marking layer 86 in an embodiment is applied beneath insulative layer 286 but can be placed alternatively onto insulative layer 286. Further alternatively, insulative layer 286 is itself partially or fully colored or suitable marked.

Any of the fuse elements 178 can have a Metcalf spot or dissimilar metal as described above for fuse element 78 of fuse 70. Any of the fuse elements herein and associated leads and traces can be of any desirable metal, such as copper, tin, silver, zinc or any suitable combination or alloy thereof.

While FIG. 13 shows a single multi-element fuse apparatus 270 in operation with tuning-fork terminals, it is expressly contemplated to have multiple multi-element fuse apparatuses 270 operating with a single junction box (not illustrated). For example, multiple fuse apparatuses 270 having elements with the like or different ratings can be provided and powered separately or in series. Each fuse apparatuses 270 has a respective tuning-fork, clip 64 and/or connector 164 arrangement. To this end, fuse apparatuses 270 can include a series contact (e.g., one of contacts 276), similar to series contact 56 of distribution board 52 of junction box 50 shown above. The series contact of one fuse apparatus 270 is placed in electrical contact with the steel core 272 of another fuse apparatus 270 to power that other apparatus.

It should be appreciated that fuse apparatus 170 of FIG. 11 could be made of the same substrate material as fuse apparatus 270. Here, any or all of power B+ conductor 168, power B+ leads 180 and power B+ contacts 176 could be exposed metal or steel 272 etched from outer ceramic layer 284. Fuse elements 178, leads 182 and contacts 174 would be formed onto ceramic layer 284, e.g., as a thick film ink. Power B+ leads 180 could also be formed onto ceramic layer 284.

Likewise, single substrate fuse 70 of FIGS. 8 to 10 could be formed from the substrate material of fuse apparatus 270. Fuse element 78 and contact 74 are printed onto insulative layer 284 in one embodiment.

It is also contemplated to make either of B+ power board 80 (FIGS. 3 and 4) and power B+ plane 160 (FIG. 12) of the same substrate material as fuse apparatus 270. Here, metal, e.g., steel, core 272 is slotted and possibly bent to make intimate contact with the appropriate contacts of substrate fuses 70 for B+ power board 80 and fuse apparatus 170 for B+ plane 160. Ceramic layer 284 can be performed or etched away around the slots as needed to aid such intimate contact.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A fuse assembly comprising:
a junction box including a power board having a plurality of metalized slots extending therethrough and a distribution board having a plurality of metalized slots extending therethrough, said distribution board spaced away from said power board; and
a plurality of fuses releasably secured within the slots, each of the fuses including a substrate and first and second contacts positioned on the substrate, the first contact in physical and electrical communication with one of the metalized slots of the power board and the second contact in physical and electrical communication with one of the metalized slots of the distribution board with the substrate extending between the slots of the distribution and power boards, and a fuse element in electrical communication with the first and second contacts.

2. The fuse assembly of claim 1, wherein the distribution board is spaced away from the power board by at least one spacing apparatus.

3. The fuse assemble of claim 1, wherein the distribution board includes at least one of: (i) a plurality of load contacts, each load contact in electrical communication with one of the metalized slots; and (ii) a series contact for powering a separate junction box.

4. The fuse assembly of claim 1, wherein the metalized slots at least one of the distribution and power boards include traces that extend to load contact areas of the traces.

5. The fuse assembly of claim 1, wherein the metalized slots of at least one of the distribution and power boards includes at least one of an interface clip and metallic trace.

6. The fuse assembly of claim 1, wherein at least one of the distribution board, power board and substrate is made of a material selected from the group consisting of: an FR-4 material, ceramic, ceramic coated metal, plastic, glass, polyimide and any suitable combination thereof.

7. The fuse assembly of claim 1, wherein the metallized slots include holding members that releasably secure each of the respective fuses.

8. The fuse assembly of claim 1, wherein at least one of the fuses includes a light source indicator electronically coupled in parallel with the fuse element, the indicator illuminating upon an opening of the fuse element.

9. The fuse assembly of claim 1, wherein at least on marking is placed on each of the respective fuse substrates, the at least one marking selected from the group consisting of: a fuse rating, branding, product number and insertion information.

10. The fuse assembly of claim 1, wherein the fuse element is a trace applied to the substrate of the fuse.

11. The fuse assembly of claim 1, which includes a dissimilar metal placed on the fuse element at a place desirable for each of the respective fuse element to open.

12. The fuse assembly of claim 1, which includes a protective coating applied over each the respective fuse elements.

13. The fuse assembly of claim 1, wherein the first and second contacts of the fuse extend to two sides of each of the respective fuse substrates.

14. The fuse assembly of claim 1, which includes a stop against which the fuses abut when inserted through the distribution and power boards.

15. The fuse assembly of claim 1, wherein the fuse substrates each define at least one removal tool aperture.

16. The fuse assembly of claim 1, wherein each fuse includes a color-coded coating applied to the fuse substrate.

17. A fuse junction box comprising:
a distribution board including a substrate having a plurality of first electrically conductive metallized slots for receiving, communicating electrically with, and releasably securing a plurality of fuses, the first conductive slots extending through the distribution board and in electrical communication with load contact areas of the distribution board; and
a power board spaced away from the distribution board, the power board including a substrate having a plurality of second electrically conductive slots for receiving, communicating electrically with, and releasably securing the fuses, the second conductive slots extending through the power board and in electrical communication with a power contact area of the power board each of the plurality of fuses including first and second contacts wherein the first contact is in physical and electrical communication with a corresponding one of the plurality of first electrically conductive metalized slots of the distribution board and the second contact is in physical and electrical communication with a corresponding one of the plurality of second electrically conductive metalized slots of the power board.

18. The fuse junction box of claim 17, wherein the first conductive slots of the distribution board are aligned with the second conductive slots of the power board.

19. The fuse junction box of claim 17, wherein the conductive slots of at least one of the distribution and power boards includes at least one of an interface clip and a metallic trace.

20. The fuse junction box of claim 17, wherein at least one of the distribution board and power board is made of a material selected from the group consisting of: an FR-4 material, ceramic, ceramic coated metal, plastic, glass, a polyimide and an organic material.

21. The fuse junction box of claim 17, wherein the fuses each include a substrate, a fuse element placed on the substrate, a first contact area contacting one of the first conductive slots, and a second contact area contacting one of the second conductive slots.

22. A fuse assembly comprising:
a power plane having a power connector;
a distribution plane having a plurality of distribution connectors, said power plane spaced from said distribution plane;
a fuse card including a plurality of fuse elements, each element connected electrically to a plated power contact and each element having a separate plated distribution contact carried by the fuse card, said fuse card configured to be inserted through the power connector and into one of the plurality of distribution connectors;
wherein the power contact is placed in electrical communication with the power connector in at least two points and each distribution contact is placed in electrical communication with one of the distribution connectors when the card is connected operably to the power and distribution plates.

23. The fuse assembly of claim 22, wherein at least one of the power plane, distribution plane and fuse card is made of a material selected from the group consisting of: an FR-4 material, ceramic, ceramic coated metal, plastic, glass, polyimide and any suitable combination thereof.

24. The fuse assembly of claim 22, wherein the power plane is a piece of stamped metal, the power connector formed in the stamped metal.

25. The fuse assembly of claim 22, wherein at least one of the power connector and the distribution connectors is fixed to the power and distribution plane, respectively, via at least one process selected from the group consisting of: reflow soldering, wave soldering, plating, and mechanical crimping.

26. The fuse assembly of claim 22, wherein the fuse elements are rated the same or differently.

27. The fuse assembly of claim 22, wherein the fuse card includes a plurality of power contacts in electrical communication with each other.

28. The fuse assembly of claim 22, which holds multiple fuse cards, each fuse card including at least one fuse element.

29. The fuse assembly of claim 22, wherein the fuse card includes a widened portion for holding the power contact.

30. The fuse assembly of claim 22, wherein each of the distribution contacts is located along a same side of the fuse card.

31. The fuse assembly of claim 22, wherein the distribution connectors of the distribution plane are in electrical communication with load contacts carried by the distribution plane.

* * * * *